(12) United States Patent
Kang

(10) Patent No.: US 8,939,377 B2
(45) Date of Patent: Jan. 27, 2015

(54) RFID DEVICE

(75) Inventor: Hee Bok Kang, Cheongju (KR)

(73) Assignee: Hynix Semiconductor Inc., Icheon-Si (KR)

( * ) Notice: Subject to any disclaimer, the term of this patent is extended or adjusted under 35 U.S.C. 154(b) by 1275 days.

(21) Appl. No.: 12/792,451

(22) Filed: Jun. 2, 2010

(65) Prior Publication Data

US 2011/0147465 A1 Jun. 23, 2011

(30) Foreign Application Priority Data

Dec. 23, 2009 (KR) ........................ 10-2009-0129396

(51) Int. Cl.
| | | |
|---|---|---|
| *G06K 19/06* | (2006.01) | |
| *H03F 3/45* | (2006.01) | |
| *G06K 19/07* | (2006.01) | |
| *H03F 3/30* | (2006.01) | |

(52) U.S. Cl.
CPC ........ *H03F 3/45179* (2013.01); *G06K 19/0723* (2013.01); *H03F 3/3016* (2013.01); *H03F 2200/411* (2013.01); *H03F 2203/30078* (2013.01); *H03F 2203/30111* (2013.01); *H03F 2203/45594* (2013.01); *H03F 2203/45596* (2013.01); *H03F 2203/45646* (2013.01)
USPC ........................................................ 235/492

(58) Field of Classification Search
CPC .................... G06K 19/0723; G06K 19/07749; G06K 7/008; G06K 19/0701; H01L 2924/15165; H01L 2224/24227; H01L 2224/97; H01L 2924/15153
USPC ........................................................ 235/492
See application file for complete search history.

(56) References Cited

U.S. PATENT DOCUMENTS

| | | | |
|---|---|---|---|
| 6,838,989 B1 * | 1/2005 | Mays et al. ................ | 340/572.1 |
| 7,500,610 B1 * | 3/2009 | Hadley et al. ................ | 235/451 |
| 2004/0135673 A1 * | 7/2004 | Oberhuber et al. .......... | 340/10.1 |
| 2007/0194933 A1 * | 8/2007 | Shanks et al. .............. | 340/572.7 |
| 2007/0200677 A1 * | 8/2007 | Murano ..................... | 340/10.31 |
| 2008/0018483 A1 * | 1/2008 | Kang ........................... | 340/584 |
| 2008/0079542 A1 | 4/2008 | Rofougaran | |
| 2011/0274141 A1 * | 11/2011 | Jantunen et al. ............. | 375/138 |
| 2012/0253594 A1 * | 10/2012 | Schreiber ....................... | 701/36 |

FOREIGN PATENT DOCUMENTS

| | | | |
|---|---|---|---|
| KR | 720227 B1 * | 5/2007 | |
| KR | 1020080034016 A | 4/2008 | |
| KR | 2008088957 A * | 10/2008 | |

* cited by examiner

*Primary Examiner* — Thien M Le
*Assistant Examiner* — Tae Kim

(57) ABSTRACT

An RFID device includes an amplification unit, a demodulator, and a modulator. The amplification unit is configured to amplify a level of a radio signal applied through an antenna, and output an amplification signal. The demodulator is configured to generate an operating voltage by rectifying and amplifying the amplification signal, demodulate the operating voltage, and generate a command signal. The modulator is configured to output a response signal, which corresponds to the command signal, to the antenna.

19 Claims, 8 Drawing Sheets

RFID DEVICE

CROSS-REFERENCE TO RELATED APPLICATION

The priority based on Korean patent application No. 10-2009-0129396, filed on Dec. 23, 2009, the disclosure of which is hereby incorporated in its entirety by reference, is claimed.

BACKGROUND OF THE INVENTION

Embodiment in accordance with the present invention relates to a radio frequency identification (RFID) device, and more specifically, to a technology which is capable of identifying an object by communicating with an external reader through transmission/reception of a radio signal.

An RFID is a contactless automatic identification technology which can automatically identifies an object by using a radio signal. Specifically, an RFID tag is attached to an object to be identified, and the RFID tag communicates with an RFID reader through transmission/reception of the radio signal. In this manner, the identification of the object is achieved. The use of the RFID can overcome the shortcomings of a conventional automatic identification technology, such as a barcode and an optical character recognition technology.

In recent years, RFID tags have been used in various fields, such as a distribution management system, a user authentication system, an electronic cash system, a traffic system, and so on.

For example, a distribution management system performs a commodity classification or an inventory management by using integrated circuit (IC) tags (in which data are recorded) instead of a delivery statement or tag. In another example, a user authentication system performs a room management by using IC cards in which personal information is recorded.

Meanwhile, a memory used in the RFID tag may be implemented with a nonvolatile ferroelectric memory.

In general, a nonvolatile ferroelectric memory (i.e., a ferroelectric random access memory (FeRAM)) is considered by many as a next generation storage device because it has a data processing speed similar to that of a dynamic random access memory (DRAM) and data is retained even when power is interrupted.

The FeRAM has a structure substantially similar to that of the DRAM but uses a ferroelectric capacitor as a storage element. Ferroelectric has a high remnant polarization characteristic. As a result, data is not lost even though an electric field is removed.

FIG. 1 illustrates an overall structure of a general RFID device.

The RFID device includes an antenna unit 1, an analog unit 10, a digital unit 20, and a memory unit 30.

The antenna unit 1 receives a radio signal transmitted from an external RFID reader. The radio signal received through the antenna unit 1 is inputted to the analog unit 10 through antenna pads 11 and 12.

The analog unit 10 amplifies the inputted radio signal and generates a power supply voltage VDD which can then be used as a driving voltage of an RFID tag. The analog unit 10 detects an operation command signal from the inputted radio signal, and outputs a command signal CMD to the digital unit 20. In addition, the analog unit 10 detects the output voltage VDD and outputs a power on reset signal POR and a clock CLK to the digital unit 20. The power on reset signal POR controls a reset operation.

The digital unit 20 receives the power supply voltage VDD, the power on reset signal POR, the clock CLK, and the command signal CMD from the analog unit 10, and outputs a response signal RP to the analog unit 10. In addition, the digital unit 20 outputs an address ADD, an input/output data I/O, a control signal CTR, and the clock CLK to the memory unit 30.

The memory unit 30 reads, writes and stores data by using a memory device.

The RFID device uses several frequency bands, and the device characteristics vary depending on the frequency bands. In general, as the frequency band is lowered, the recognition speed of the RFID device becomes slower, and the RFID device operates at a shorter distance and is less influenced by the surrounding environment. On the other hand, as the frequency band becomes higher, the recognition speed of the RFID device becomes faster, and the RFID device operates at a longer distance and is greatly influenced by the surrounding environment.

Meanwhile, when a distance between the external reader and the RFID device is far, a weak radio signal is inputted to the RFID device. The inputted weak radio signal may not reach a certain level at which a Schottky diode or the like provided inside a demodulator can be driven. In this case, the long-distance recognition performance of the RFID device is deteriorated.

BRIEF SUMMARY OF THE INVENTION

Various embodiments of the present invention are directed to providing an RFID device which can detect a weak input signal by amplifying a radio signal inputted through a low noise amplifier (LNA) and outputting the amplified radio signal to a demodulator, thereby improving the long-distance recognition performance of the RFID device.

In an embodiment of the present invention, an RFID device includes: an amplification unit configured to amplify a level of a first radio signal applied through an antenna, and output an amplified radio signal; a demodulator configured to generate an operating voltage according to and the amplified radio signal, and generate a command signal by demodulating the operating voltage; and a modulator configured to output a second radio signal, the second radio signal being generated according to a response signal corresponding to the command signal.

DESCRIPTION OF EMBODIMENTS

Description will now be made in detail with reference to the embodiments of the present invention and accompanying drawings. Wherever possible, the same reference numbers will be used throughout the drawings to refer to the same or like elements.

Figure 1:
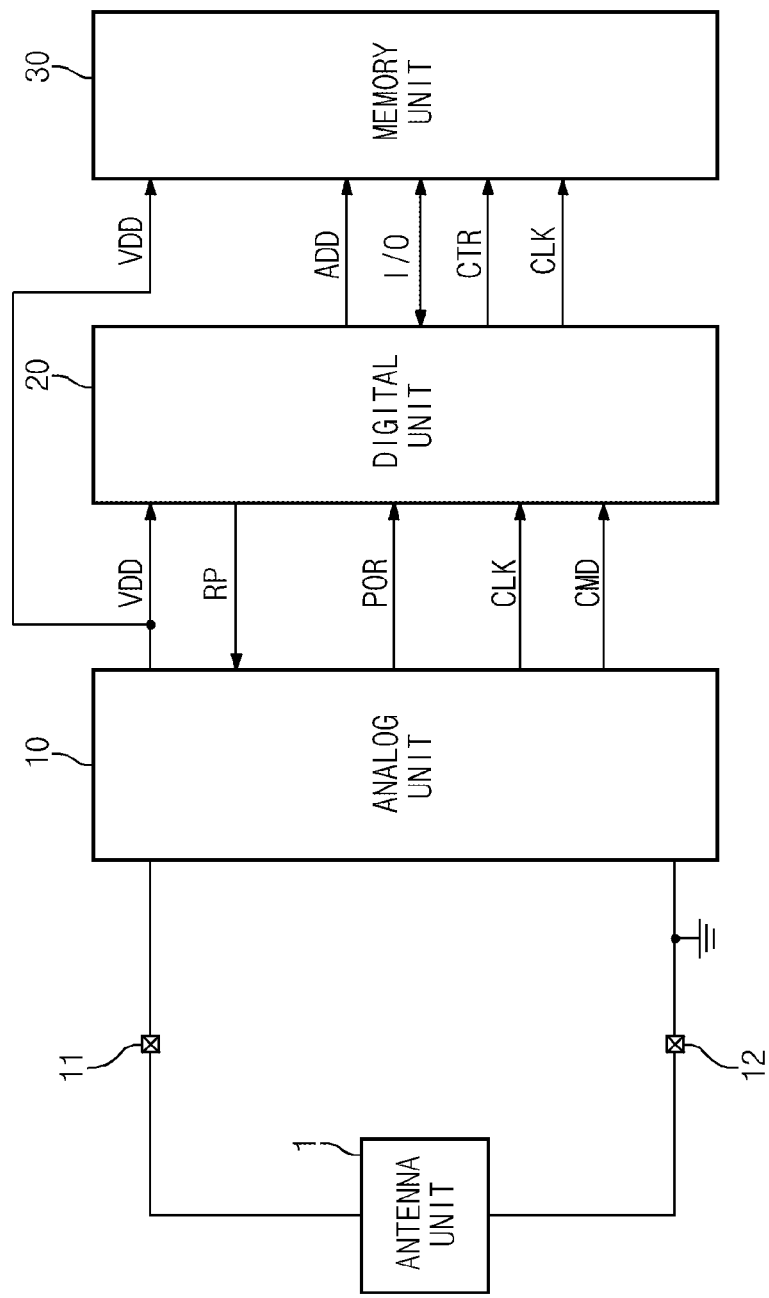
FIG. 1 is a block diagram of a general RFID device.
Figure 2:
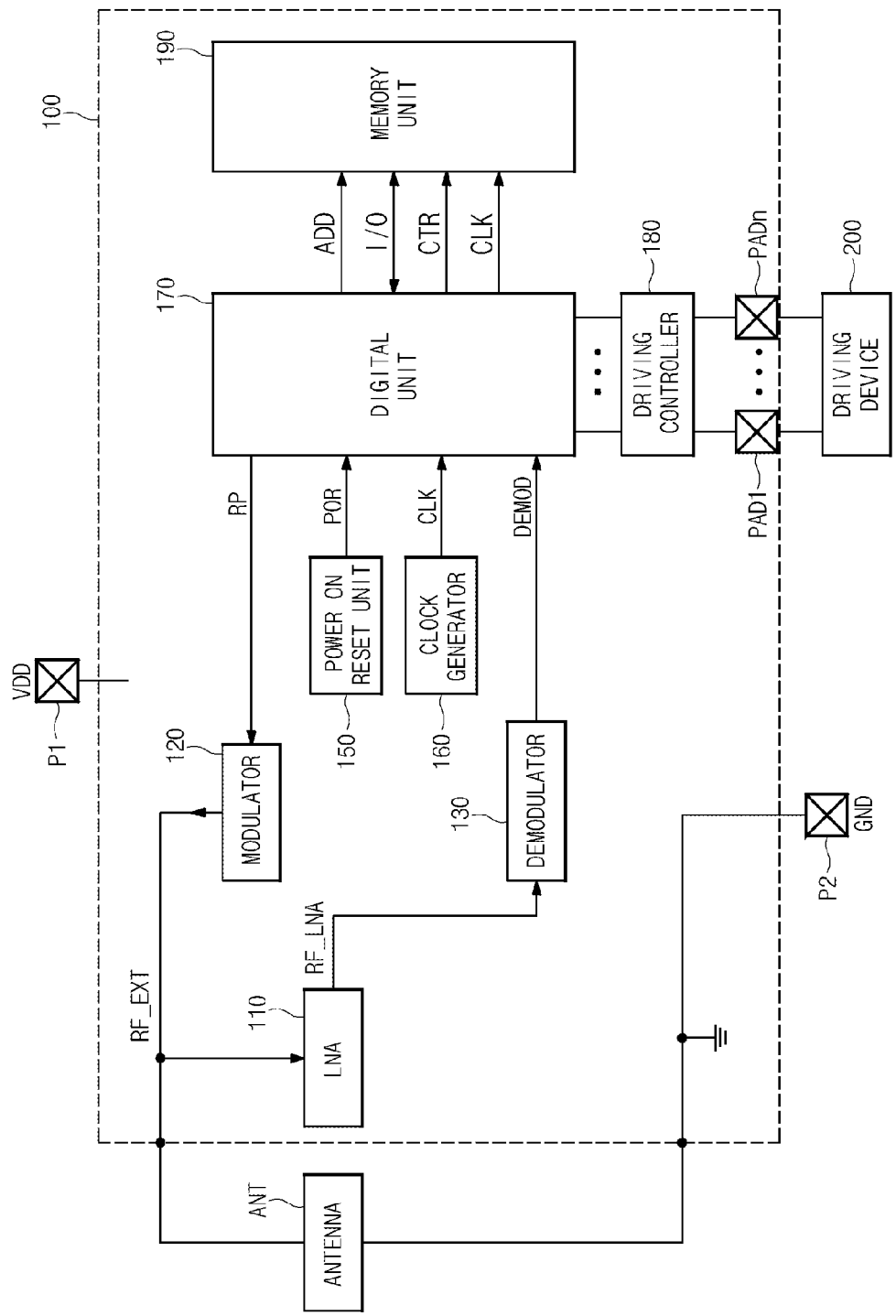
FIG. 2 is a block diagram of an RFID device according to an embodiment of the present invention.

FIG. 2 is a block diagram of an RFID device according to an embodiment of the present invention.

Referring to FIG. 2, an RFID system includes the RFID device 100 and an antenna ANT, wherein the RFID device 100 includes a low noise amplifier (LNA) 110, a modulator 120, a demodulator 130, a power on reset unit 150, a clock generator 160, a digital unit 170, a driving controller 180, a memory unit 190, and a plurality of pads PAD1 to PADn, n being a positive integer. The plurality of pads PAD1 to PADn is coupled to an external driving device 200.

First, the antenna ANT receives an external radio signal RF_EXT transmitted from an external RFID reader. The external radio signal RF_EXT transmitted into the RFID device 100 through the antenna ANT is inputted to the LNA 110 through an antenna pad (not shown).

Furthermore, the antenna ANT transmits an internal radio signal received from the RFID device 100 to the external RFID reader. That is, the internal radio signal applied from the modulator 120 to the antenna ANT is transmitted to the external RFID reader through the antenna pad.

The LNA 110 amplifies the external radio signal RF_EXT while minimizing added noise. That is, the LNA 110 amplifies the external radio signal RF_EXT while minimizing noise added to the external radio signal RF_EXT applied through the antenna ANT, and outputs an amplified radio signal RF_LNA to the demodulator 130.

The modulator 120 generates the internal radio signal by modulating a response signal RP applied from the digital unit 170, and outputs the internal radio signal to the antenna ANT.

The demodulator 130 generates a command signal DEMOD by demodulating the amplified radio signal RF_LNA applied from the LNA 110, and outputs the command signal DEMOD to the digital unit 170.

The power on reset unit 150 detects a voltage level of a power supply voltage VDD generated at a power supply voltage pad P1, and outputs a power on reset signal POR to the digital unit 170. The power on reset signal POR controls a reset operation.

The power on reset signal POR rises with the power supply voltage while the power supply voltage goes from a low level to a high level. The power on reset signal POR then changes from a high level to a low level at the moment when the power supply voltage reaches the power supply voltage level VDD, thereby resetting an internal circuit of the RFID device 100.

The clock generator 160 supplies the digital unit 170 with a clock CLK which controls an operation of the digital unit 170, wherein the clock CLK is generated depending on the power supply voltage VDD.

In this embodiment, the RFID device 100 is driven by the external power supply voltage pad P1 and an external ground voltage pad P2 that are located outside the RFID device 100. In a conventional RFID device, an RFID tag receives a radio signal through communication with the RFID reader. The radio signal then supplies the power supply voltage VDD through a voltage amplification unit provided inside the RFID tag.

In this embodiment, however, a large amount of power is consumed because the RFID device 100 is coupled to the external driving device 200. Accordingly, in this embodiment, the power supply voltage VDD and a ground voltage GND are supplied to the RFID device 100 through the external power supply voltage pad P1 and the external ground voltage pad P2.

The digital unit 170 receives the power supply voltage VDD, the power on reset signal POR, the clock CLK, and the command signal DEMOD, interprets the command signal DEMOD, and generates a control signal and processing signals. The digital unit 170 outputs the response signal RP, which corresponds to the control signal and the processing signals, to the modulator 120. In addition, the digital unit 170 outputs an address ADD, data I/O, a control signal CTR, and the clock CLK to the memory unit 190.

The driving controller 180 is coupled between the digital unit 170 and the plurality of pads PAD1 to PADn. The driving controller 180 outputs driving signals, which control an operation of the driving device 200 provided outside the RFID device 100, to the plurality of pads PAD1 to PADn according to the command signal applied from the digital unit 170. The driving device 200 is coupled to the driving controller 180 of the RFID device 100 through the plurality of pads PAD1 to PADn.

The plurality of pads PAD1 to PADn are coupled to the driving device 200 through connection pins, and correspond to a coupling unit which couples the RFID device 100 to the driving device 200. The driving device 200 corresponds to a driving control device which controls an operation of a light emitting diode (LED), a motor, or a speaker.

The memory unit 190 includes a plurality of memory cells, each of which writes data to a storage element and reads out data stored in the storage element.

The memory unit 190 may be implemented with a nonvolatile ferroelectric memory (FeRAM). The FeRAM has a data processing speed similar to that of a DRAM. Also, the FeRAM has a structure substantially similar to that of the DRAM. The FeRAM uses a ferroelectric material as a capacitor, so that it has a high remnant polarization characteristic which is a characteristic of the ferroelectric material. Due to the remnant polarization characteristic, data is not lost even though an electric field is removed.

Figure 3:
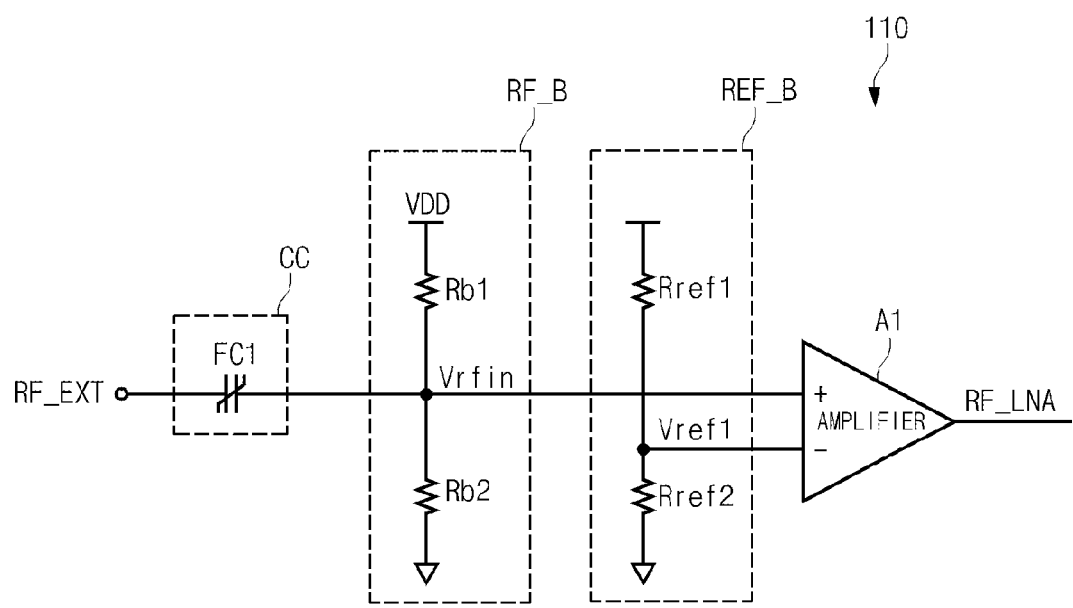
FIG. 3 is a detailed circuit diagram of an LNA in FIG. 2.

FIG. 3 is a detailed circuit diagram of the LNA 110 in FIG. 2.

Referring to FIG. 3, the LNA 110 includes a coupling capacitor unit CC, a bias unit RF_B, a reference bias unit REF_B, and an amplifier A1.

The coupling capacitor unit CC increases a voltage level of the external radio signal RF_EXT applied from the antenna ANT and outputs the increased external radio signal to a node of a voltage Vrfin. The coupling capacitor unit CC includes a ferroelectric capacitor coupled between an input terminal of the external radio signal RF_EXT and the Vrfin node.

The bias unit RF_B controls a bias voltage at the Vrfin node. The bias unit RF_B includes bias resistors Rb1 and Rb2. The bias resistor Rb1 is coupled between a power supply voltage (VDD) terminal and the Vrfin node, and the bias resistor Rb2 is coupled between the Vrfin node and a ground voltage (GND) terminal.

The reference bias unit REF_B controls a bias voltage at a reference voltage Vref1 node. The reference bias unit REF_B includes reference resistors Rref1 and Rref2. The reference resistor Rref1 is coupled between the VDD terminal and the Vref1 node, and the reference resistor Rref2 is coupled between the Vref1 node and the GND terminal.

The amplifier A1 generates the amplified radio signal RF_LNA by amplifying a voltage level at the Vrfin node with reference to the reference voltage Vref1. The amplifier A1 then outputs the amplified radio signal RF_LNA to the demodulator 130. A positive (+) input terminal of the amplifier A1 is coupled to the Vrfin node, and the reference voltage Vref1 is applied to a negative (−) input terminal of the amplifier A1.

Figure 4:
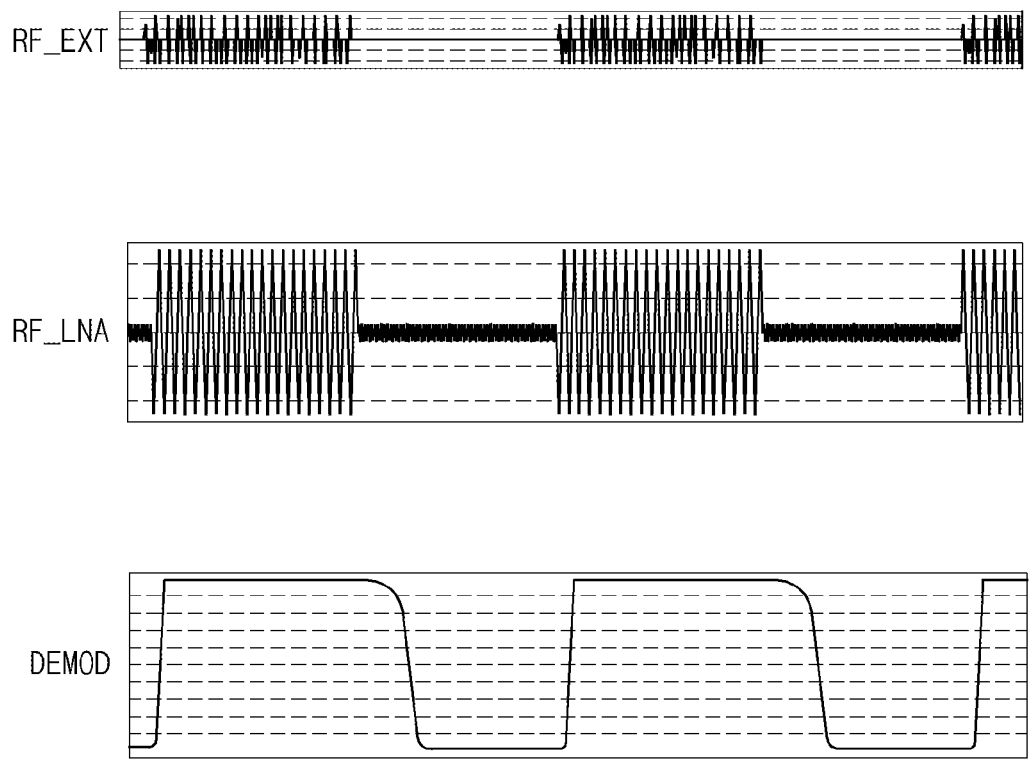
FIG. 4 is a waveform diagram explaining an operation of the LNA in FIG. 3.

FIG. 4 is a waveform diagram explaining an operation of the LNA 110 in FIG. 3.

First, the external radio signal RF_EXT is inputted through the antenna ANT. The external radio signal RF_EXT transmitted into the RFID device 100 through the antenna ANT is applied to the LNA 110.

Subsequently, the LNA 110 amplifies the external radio signal RF_EXT applied through the antenna ANT, and outputs the amplified radio signal RF_LNA to the demodulator 130. The amplified radio signal RF_LNA has a frequency equal to that of the external radio signal RF_EXT and has an amplified voltage level.

The external radio signal RF_EXT applied through the antenna ANT is very weak. At this point, it may be impossible to drive a Schottky diode included in the demodulator 130. Accordingly, the LNA 110 amplifies the external radio signal RF_EXT and generates the amplified radio signal RF_LNA having a voltage level at which the Schottky diode included in the demodulator 130 can be driven.

The demodulator 130 generates the command signal DEMOD by demodulating the amplified radio signal RF_LNA applied from the LNA 110, and outputs the command signal DEMOD to the digital unit 170. That is, the demodulator 130 detects the command signal DEMOD by using an envelope detector implemented with the Schottky diode.

Figure 5:
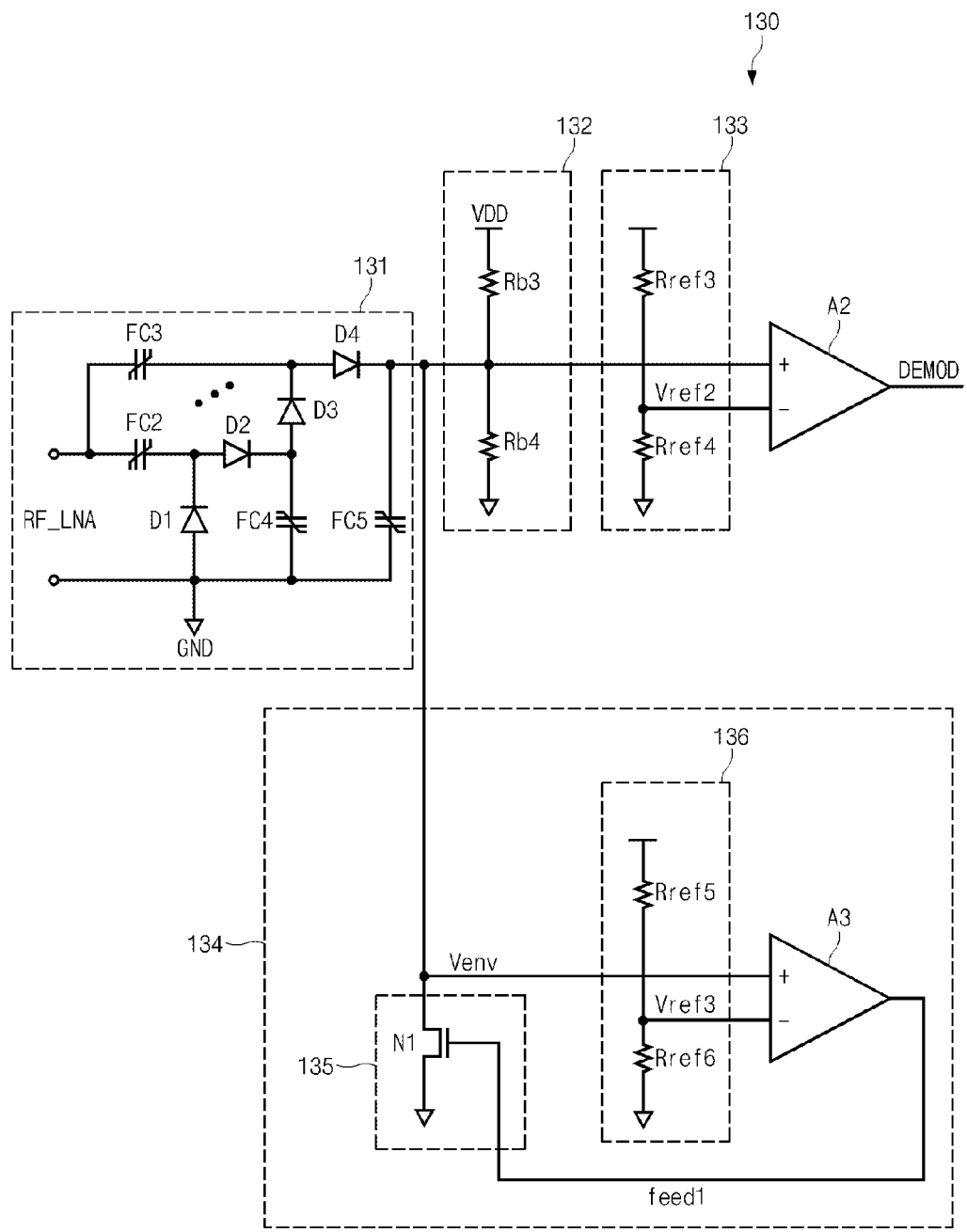
FIG. 5 is a detailed circuit diagram of a demodulator in FIG. 2.

FIG. 5 is a detailed circuit diagram of the demodulator 130 in FIG. 2.

Referring to FIG. 5, the demodulator 130 includes a signal rectifier 131, a bias unit 132, a reference bias unit 133, a main amplifier A2, and an envelope level adjustment unit 134.

The signal rectifier 131 includes a plurality of ferroelectric capacitors FC2 to FC5 and a plurality of diodes D1 to D4, and detects a voltage level of the command signal DEMOD. The plurality of diodes D1 to D4 may be implemented with Schottky diodes.

When the amplified radio signal RF_LNA is applied from the LNA 110, the signal rectifier 131 having the above-described configuration generates an operating voltage Venv of the RFID device 100 by performing an rectification operation of the diodes D1 to D4 and a charge pumping operation of the ferroelectric capacitors FC2 to FC5.

That is, charges are stored in the ferroelectric capacitor FC4 by the rectification operation of the diodes D1 and D2, and the charges stored in the ferroelectric capacitor FC4 are pumped and stored in the nonvolatile ferroelectric capacitor FC5 by the rectification operation of the diodes D3 and D4. The rectification operation and the pumping operation are sequentially performed to generate the operating voltage Venv through the diode D4 of a final stage.

The bias unit 132 supplies a constant bias voltage to anode of the operating voltage Venv. The bias unit 132 includes bias resistors Rb3 and Rb4. The bias resistor Rb3 is coupled between the VDD terminal and the node of the operating voltage Venv, and the bias resistor Rb4 is coupled between the node of the operating voltage Venv and the GND terminal.

The reference bias unit 133 supplies a constant bias voltage to a node of a reference voltage Vref2. The reference bias unit 133 includes reference resistors Rref3 and Rref4. The reference resistor Rref3 is coupled between the VDD terminal and the node of the reference voltage Vref2, and the reference resistor Rref4 is coupled between the node of the reference voltage Vref2 and the GND terminal.

The main amplifier A2 generates the command signal DEMOD by amplifying the operating voltage Venv with reference to the reference voltage Vref2, and outputs the command signal DEMOD to the digital unit 170. The operating voltage Venv is applied to a positive (+) input terminal of the main amplifier A2, and the reference voltage Vref2 is applied to a negative (−) input terminal of the main amplifier A2.

The envelope level adjustment unit 134 includes a pull-down adjustment unit 135, a reference bias unit 136, and an envelope amplifier A3. The envelope level adjustment unit 134 adjusts a voltage level of the operating voltage Venv.

The pull-down adjustment unit 135 includes an NMOS transistor N1. The NMOS transistor N1 is coupled between the node of the operating voltage Venv and the GND terminal, and a voltage feed1 is applied to a gate of the NMOS transistor N1. In the pull-down adjustment unit 135, when the voltage feed1 is applied at a high level, the NMOS transistor N1 is turned on to pull down the operating voltage Venv to the GND level.

The reference bias unit 136 supplies a constant bias voltage to a node of a reference voltage Vref3. The reference bias unit 136 includes reference resistors Rref5 and Rref6. The reference resistor Rref5 is coupled between the VDD terminal and the node of the reference voltage Vref3, and the reference resistor Rref6 is coupled between the node of the reference voltage Vref3 and the GND terminal.

The envelope amplifier A3 generates the voltage feed1 by amplifying the operating voltage Venv with reference to the reference voltage Vref3, and outputs the voltage feed1 to the pull-down adjustment unit 135. The operating voltage Venv is applied to a positive (+) input terminal of the envelope amplifier A3, and the reference voltage Vref3 is applied to a negative (−) input terminal of the envelope amplifier A3. In this embodiment, the reference voltage Vref3 may be set to a voltage level higher than that of the reference voltage Vref2 by a predetermined voltage.

Figure 6:
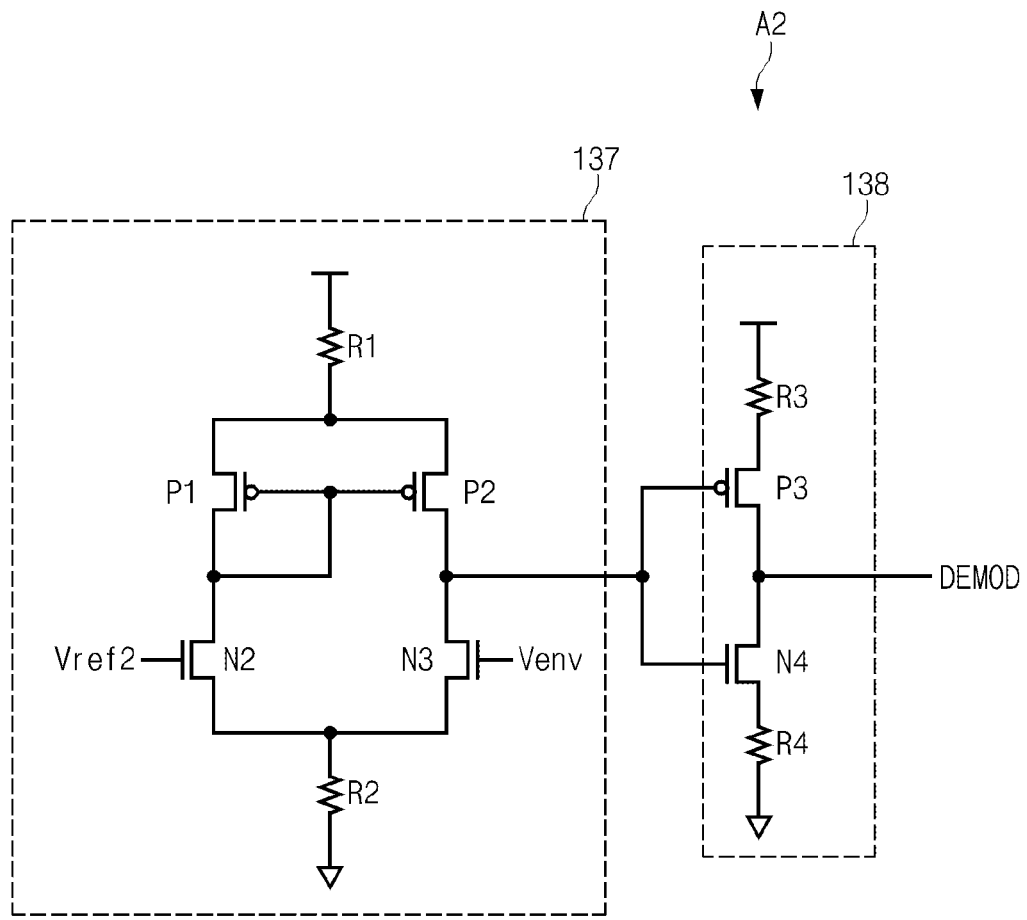
FIG. 6 is a detailed circuit diagram of a main amplifier in FIG. 5.

FIG. 6 is a detailed circuit diagram of the main amplifier A2 in FIG. 5.

Referring to FIG. 6, the main amplifier A2 includes an amplification unit 137 and a buffer unit 138.

The amplification unit 137 includes resistors R1 and R2, PMOS transistors P1 and P2, and NMOS transistors N2 and N3.

The resistor R1 is coupled between the VDD terminal and the PMOS transistors P1 and P2. The resistor R2 is coupled between the NMOS transistors N2 and N3 and the GND terminal.

The PMOS transistors P1 and P2 are coupled between the resistor R1 and the NMOS transistors N2 and N3, and their gate terminals are commonly coupled together. The NMOS transistor N2 is coupled between the PMOS transistor P1 and the resistor R2, and receives the reference voltage Vref2 through a gate terminal thereof. The NMOS transistor N3 is coupled between the PMOS transistor P2 and the resistor R2, and receives the operating voltage Venv through a gate terminal thereof.

The buffer unit 138 includes resistors R3 and R4, a PMOS transistor P3, and an NMOS transistor N4. The resistor R3, the PMOS transistor P3, the NMOS transistor N4, and the resistor R4 are coupled in series between the VDD terminal and the GND terminal.

A common gate terminal of the PMOS transistor P3 and the NMOS transistor N4 is coupled to an output terminal of the amplification unit 137, and the command signal DEMOD is outputted through a common drain terminal of the PMOS transistor P3 and the NMOS transistor N4.

The resistors R1 to R4 serve as current limit resistor elements which limit a driving current by using resistor elements having large resistances, and make a small current, e.g., 1 μm or less, flow through the buffer unit 138.

Figure 7:
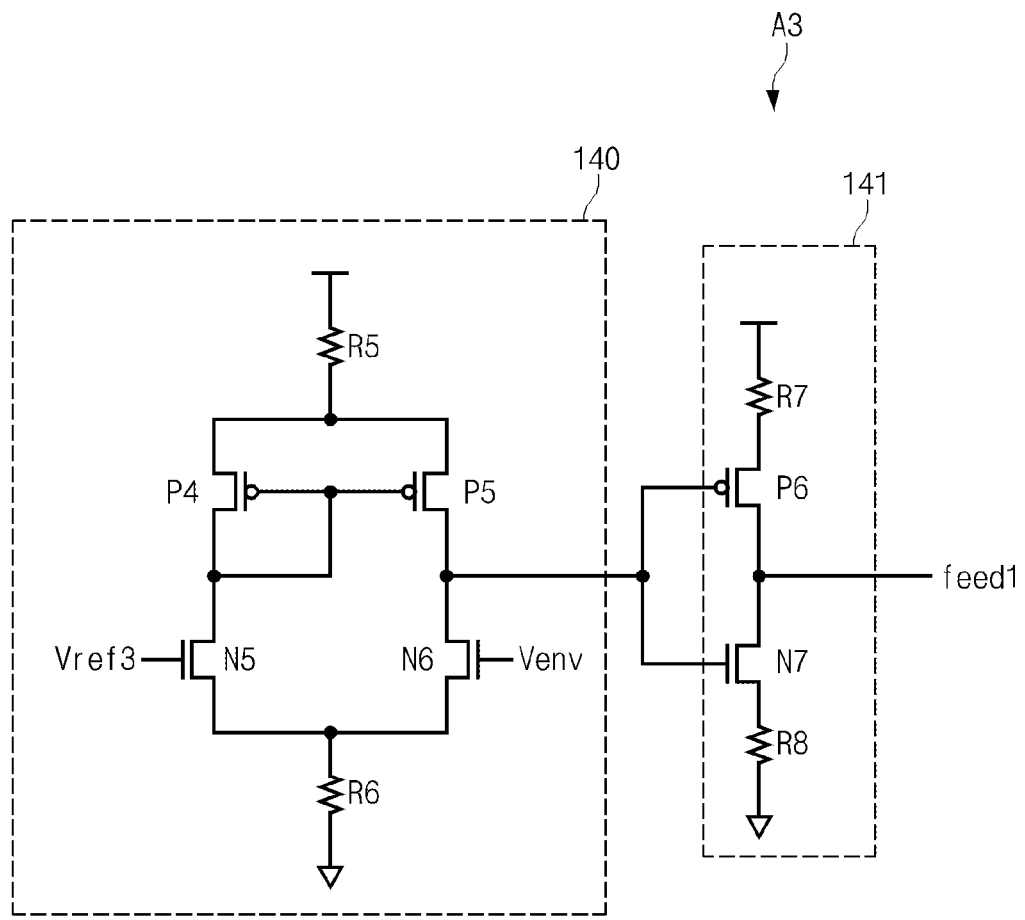
FIG. 7 is a detailed circuit diagram of an envelope amplifier in FIG. 5.

FIG. 7 is a detailed circuit diagram of the envelope amplifier A3 in FIG. 5.

Referring to FIG. 7, the envelope amplifier A3 includes an amplification unit 140 and a buffer unit 141.

The amplification unit 140 includes resistors R5 and R6, PMOS transistors P4 and P5, and NMOS transistors N5 and N6.

The resistor R5 is coupled between the VDD terminal and the PMOS transistors P4 and P5. The resistor R6 is coupled between the NMOS transistors N5 and N6 and the GND terminal.

The PMOS transistors P4 and P5 are coupled between the resistor R5 and the NMOS transistors N5 and N6, and their gate terminals are commonly coupled together. The NMOS transistor N5 is coupled between the PMOS transistor P4 and the resistor R6, and receives the reference voltage Vref3 through a gate terminal thereof. The NMOS transistor N6 is coupled between the PMOS transistor P5 and the resistor R6, and receives the operating voltage Venv through a gate terminal thereof.

The buffer unit 141 includes resistors R7 and R8, a PMOS transistor P6, and an NMOS transistor N7. The resistor R7, the PMOS transistor P6, the NMOS transistor N7, and the resistor R8 are coupled in series between the VDD terminal and the GND terminal.

A common gate terminal of the PMOS transistor P6 and the NMOS transistor N7 is coupled to the amplification unit 140, and the voltage feed1 is outputted through a common drain terminal of the PMOS transistor P6 and the NMOS transistor N7.

The resistors R5 to R8 serve as current limit resistor elements which limit a driving current by using resistor elements having large resistances, and make a small current, e.g., 1 μm or less, flow through the buffer unit 141.

The operation of the RFID device configured as above in accordance with an embodiment of the present invention will be described with reference to a waveform diagram of FIG. 8.

Figure 8:
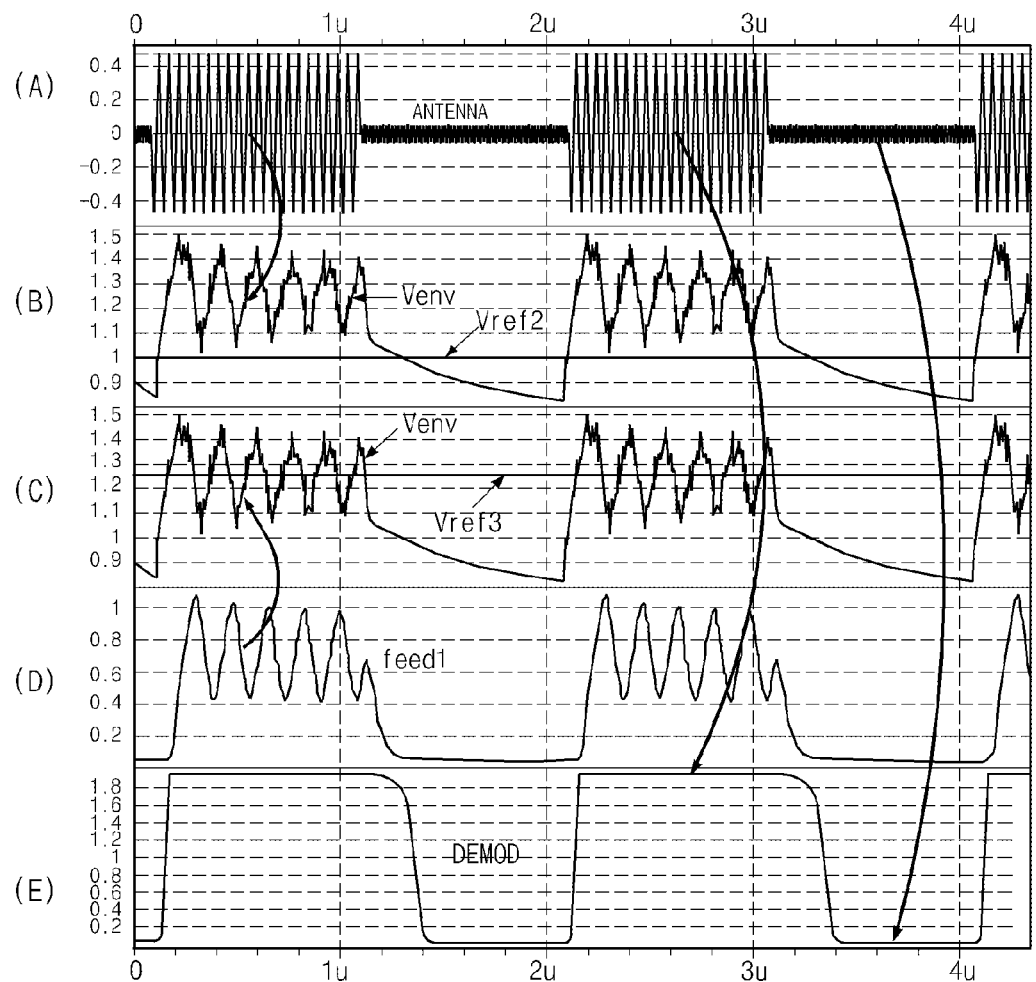
FIG. 8 is a waveform diagram explaining an operation of the RFID device according to an embodiment of the present invention.

First, as illustrated in (A) of FIG. 8, the antenna ANT receives the radio signal RF_EXT transmitted from the external RFID reader. The radio signal RF_EXT transmitted into the RFID device 100 through the antenna ANT is inputted to the LNA 110 through the antenna pad.

The radio signal RF_EXT inputted to the LNA 110 is transmitted to the Vrfin node through the coupling capacitor unit CC. The amplifier A1 compares and amplifies the voltage applied through the bias unit RF_B and the reference voltage Vref1 applied through the reference bias unit REF_B, and outputs the amplified radio signal RF_LNA to the demodulator 130.

At this time, when a distance between the RFID device 100 and the external reader is far, the radio signal RF_EXT inputted to the RFID device 100 is very weak. In this case, an amplifier having almost no noise must be used in order to significantly increase the voltage level of the weak signal. Accordingly, in this embodiment, the LNA 110 which only adds a small amount of noise is used to amplify the radio signal RF_EXT.

Subsequently, the amplified radio signal RF_LNA outputted from the amplifier A1 is applied to the signal rectifier 131 of the demodulator 130. The signal rectifier 131 rectifies and charge-pumps the amplified radio signal RF_LNA and outputs the operating voltage Venv having a waveform shown in (B) of FIG. 8.

In the demodulator 130, the main amplifier A2 compares and amplifies the reference voltage Vref2 and the operating voltage Venv, and outputs the command signal DEMOD having a waveform shown in (E) of FIG. 8. In the main amplifier A2, the reference voltage Vref2 and the operating voltage Venv are used as differential inputs of the amplification unit 137.

The envelope amplifier A3 compares and amplifies the operating voltage Venv and the reference voltage Vref3, and generates the voltage feed1 having a waveform shown in (D) of FIG. 8. In the envelope amplifier A3, the operating voltage Venv and the reference voltage Vref3 are used as differential inputs of the amplification unit 140. At this time, the reference voltage Vref3 may be set to a voltage level higher than that of the reference voltage Vref2 by a predetermined voltage.

That is, the envelope amplifier A3 outputs the voltage feed1 of a high level when the voltage level of the operating voltage Venv rises above the reference voltage Vref3. In this case, the pull-down adjustment unit 135 is turned on in response to the voltage feed1 of the high level to pull down the operating voltage Venv to the GND level. Accordingly, the voltage level of the operating voltage Venv is controlled by the voltage feed1 so that it does not rise above a certain voltage.

On the other hand, the envelope amplifier A3 outputs the voltage feed1 of a low level when the voltage level of the operating voltage Venv becomes lower than that of the reference voltage Vref3. In this case, the pull-down adjustment unit 135 is turned off so that the voltage level of the operating voltage Venv rises again.

The envelope level adjustment unit 134 detects an envelope voltage level of the operating voltage Venv according to the voltage feed1, and generates the operating voltage Venv having a waveform shown in (C) of FIG. 8. The voltage level of the operating voltage Venv is continuously adjusted with reference to the reference voltage Vref3.

Accordingly, the RF signal can be processed because the main amplifier A2 is controlled at a high response speed by limiting the voltage level of the operating voltage Venv to the range of the reference voltage Vref3.

In accordance with an embodiment of the present invention, the radio signal RF_EXT applied to the RFID device 100 through the LNA 110 is amplified. Therefore, the RFID device can detect the weak radio signal regardless of the distance between the RFID device and the external reader, thereby improving the RFID recognition performance.

When the radio signal RF_EXT is inputted from the outside to the antenna ANT, the command signal DEMOD having a high level is outputted. On the other hand, when the radio signal RF_EXT is not inputted from the outside to the antenna ANT, the command signal DEMOD having a low level is outputted.

In recent years, lighting installed in buildings are using a plurality of LEDs. In this case, a specific light pattern can be provided by individually controlling the on/off operations of the LEDs. Furthermore, a desired brightness can be provided by controlling individual LEDs among the plurality of lights, or lights positioned at desired locations can be separately controlled.

In the above-described lighting controlling method, the lighting can be remotely controlled through the RFID device. Specifically, an RFID tag is attached to an LED device, and a desired signal is transmitted over a radio frequency through an external reader. The RFID tag attached to the LED device recognizes the transmitted signal and receives a separate command according to a unique ID. In this way, the number and brightness of the LEDs can be controlled as desired.

Such an RFID tag is relatively cheaper than a general wireless remote controller. Hence, in a case where the RFID tag is applied to the lightings or the like, the implementation costs can be reduced and more options can be provided to users.

According to the embodiments of the present invention, a weak input signal can be detected by amplifying a radio signal transmitted into the RFID device using the LNA and outputting the amplified radio signal to the demodulator. As a result, it is possible to improve the long-distance recognition performance of the RFID device.

The above embodiments of the present invention are illustrative and not limitative. Various alternatives and equivalents are possible. Other additions, subtractions, or modifications are obvious in view of the present disclosure and are intended to fall within the scope of the appended claims.

What is claimed is:

1. A radio frequency identification (RFID) device comprising:
   an amplification circuit configured to amplify a level of a first radio signal applied through an antenna, and output an amplified radio signal;
   a demodulator configured to generate an operating voltage according to the amplified radio signal, and generate a command signal by demodulating the operating voltage; and
   a modulator configured to output a second radio signal, the second radio signal being generated according to a response signal corresponding to the command signal,
   wherein the demodulator comprises:
      a main amplifier configured to amplify the operating voltage with reference to a second reference voltage, and output the command signal; and
      an envelope level adjustment unit configured to control a level of the operating voltage according to a third reference voltage, and
   wherein the demodulator further comprises:
      a signal rectifier configured to generate the operating voltage by rectifying and amplifying the amplified radio signal;
      a second bias circuit configured to supply a constant bias voltage to a node of the operating voltage; and
      a second reference bias circuit configured to generate the second reference voltage having a substantially constant voltage level.

2. The RFID device according to claim 1, wherein the amplification circuit comprises a low noise amplifier (LNA).

3. The RFID device according to claim 1, wherein the amplification circuit comprises:
   a coupling capacitor circuit configured to increase a voltage level of the first radio signal and output the increased radio signal to a first node;
   a first bias circuit configured to supply a bias voltage to the first node, the bias voltage having a substantially constant value;
   a first reference bias circuit configured to generate a first reference voltage having a substantially constant voltage level; and
   a first amplifier configured to amplify a voltage of the first node with reference to the first reference voltage, and output the amplified radio signal.

4. The RFID device according to claim 3, wherein the coupling capacitor circuit comprises a ferroelectric capacitor.

5. The RFID device according to claim 1, wherein the amplified radio signal has a frequency substantially the same as that of the first radio signal.

6. The RFID device according to claim 1, wherein the third reference voltage has a level higher than that of the second reference voltage.

7. The RFID device according to claim 1, wherein the main amplifier comprises:
   a first amplification circuit configured to compare and amplify the second reference voltage and the operating voltage; and
   a first buffer circuit configured to buffer an output of the first amplification circuit and output the command signal.

8. The RFID device according to claim 1, wherein the main amplifier comprises a current limit resistor element that is configured to limit a driving current.

9. The RFID device according to claim 1, wherein the envelope level adjustment circuit comprises:
   a third reference bias circuit configured to supply a substantially constant voltage to a node of the third reference voltage;
   an envelope amplifier configured to compare and amplify the third reference voltage and the operating voltage; and
   a pull-down adjustment circuit configured to selectively pull down the operating voltage according to an output voltage of the envelope amplifier.

10. The RFID device according to claim 9, wherein the envelope amplifier comprises:
    a second amplification circuit configured to compare and amplify the third reference voltage and the operating voltage; and
    a second buffer circuit configured to buffer an output of the second amplification circuit.

11. The RFID device according to claim 1, wherein the envelope level adjustment circuit pulls down the operating voltage when the operating voltage is equal to or higher than the third reference voltage.

12. The RFID device according to claim 1, wherein the signal rectifier comprises a plurality of ferroelectric capacitors and a plurality of Schottky diodes.

13. The RFID device according to claim 1, further comprising:
    a power supply voltage pad configured to supply a power supply voltage; and
    a ground voltage pad configured to supply a ground voltage.

14. The RFID device according to claim 1, further comprising:
    a digital circuit configured to generate a control signal, processing signals and the response signal according to the command signal;
    a coupling circuit coupled to an external driving device; and
    a driving controller configured to output a driving signal to the coupling circuit according to the control signal, the driving signal being generated to control an operation of the driving device.

15. The RFID device according to claim 14, wherein the coupling circuit comprises a pad coupled between the driving device and the driving controller.

16. The RFID device according to claim 14, further comprising a memory circuit configured to perform a data read or write operation according to the processing signals applied from the digital circuit.

17. The RFID device according to claim 16, wherein the memory circuit comprises a nonvolatile ferroelectric memory.

18. The RFID device according to claim 14, further comprising a power on reset circuit configured to generate a power-on-reset signal and output the power-on-reset signal to the digital circuit.

19. The RFID device according to claim 14, further comprising a clock generator configured to generate a clock signal and output the clock sign to the digital circuit.

* * * * *